US010027984B2

(12) United States Patent
Karaje et al.

(10) Patent No.: US 10,027,984 B2
(45) Date of Patent: Jul. 17, 2018

(54) METHODS AND SYSTEMS FOR EFFICIENTLY READING A DATA BLOCK FROM A DATA SEGLET WITH COMPRESSED DATA BLOCKS

(71) Applicant: HEWLETT PACKARD ENTERPRISE DEVELOPMENT LP, Houston, TX (US)

(72) Inventors: Gurunatha Karaje, Santa Clara, CA (US); Hy Vu, Milpitas, CA (US); Rajat Sharma, San Jose, CA (US); Senthil Kumar Ramamoorthy, Sunnyvale, CA (US); Srikant Varadan, Fremont, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/590,438

(22) Filed: May 9, 2017

(65) Prior Publication Data

US 2018/0152733 A1    May 31, 2018

Related U.S. Application Data

(60) Provisional application No. 62/427,987, filed on Nov. 30, 2016.

(51) Int. Cl.

| G11C 29/40 | (2006.01) |
| H04N 19/66 | (2014.01) |
| H04N 19/119 | (2014.01) |
| H04N 19/14 | (2014.01) |
| H04N 19/42 | (2014.01) |
| H04N 19/68 | (2014.01) |
| H04N 19/86 | (2014.01) |

(52) U.S. Cl.
CPC .......... *H04N 19/66* (2014.11); *H04N 19/119* (2014.11); *H04N 19/14* (2014.11); *H04N 19/42* (2014.11); *H04N 19/68* (2014.11); *H04N 19/865* (2014.11); *G11C 29/40* (2013.01)

(58) Field of Classification Search
CPC ...................................................... G11C 29/40
USPC ........................................................ 365/149
See application file for complete search history.

(56) References Cited

U.S. PATENT DOCUMENTS

| 5,563,920 | A | 10/1996 | Fimoff et al. |
| 6,243,081 | B1 | 6/2001 | Goris et al. |
| 6,532,121 | B1 | 3/2003 | Rust et al. |
| 7,962,727 | B2 | 6/2011 | Frank |
| 8,885,426 | B1 * | 11/2014 | Burstein ................ G11C 29/40 |
| | | | 365/149 |
| 2013/0290615 | A1 | 10/2013 | Shah |
| 2015/0220277 | A1 | 8/2015 | Lee et al. |

* cited by examiner

Primary Examiner — Jason Lappas (57) ABSTRACT

When data blocks of a data seglet are compressed using a shared dictionary and when the requested data block (or blocks) do not include the last data block of the data seglet, an optimization in the read path may involve decompressing a certain portion of the data seglet from a starting position of the data seglet to a decompression endpoint of the data seglet, but not including the portion of the data seglet following the decompression endpoint. Such technique may involve the storing of a mapping that maps, for each data block within the data seglet, an identifier of the data block to a decompression endpoint that indicates a portion of the data seglet that includes the data block.

20 Claims, 11 Drawing Sheets

METHODS AND SYSTEMS FOR EFFICIENTLY READING A DATA BLOCK FROM A DATA SEGLET WITH COMPRESSED DATA BLOCKS

RELATED APPLICATIONS

This application is a non-provisional patent application of and claims priority to U.S. Provisional Application No. 62/427,987, filed 30 Nov. 2016, which is assigned to the assignee of the present invention and is incorporated by reference herein.

FIELD OF THE INVENTION

The present invention relates to data compression and data decompression, and more particularly relates to techniques for efficiently reading a data block from a data seglet with a plurality of compressed data blocks.

BACKGROUND

Data compression is a process that transforms data from a first representation into a second representation, in which the second representation is more compact than the first representation (e.g., more compact in term of the number of bytes used to store the representation). Data compression offers advantages for both data storage and data transmission. In the case of data storage, compressed data occupies less storage space, allowing more data to be stored for the same quantity of storage space. In the case of data transmission, compressed data can be transmitted with less power and in less time than uncompressed data.

Data compression, however, comes with some tradeoffs, including an increased delay between the time a request for data is received, and the time the data can be consumed (e.g., before music can be played, before a video can be viewed, etc.). One contributor of the increased delay is the step of decompression, which must be performed on compressed data before the compressed data can be consumed. Techniques to shorten such delay are discussed below.

SUMMARY OF THE INVENTION

In accordance with one embodiment, when data blocks of a data seglet are compressed using a shared dictionary and when the requested data block (or blocks) do not include the last data block of the data seglet, an optimization in the read path may involve decompressing a certain portion of the data seglet from a starting position of the data seglet to a decompression endpoint of the data seglet, but not including the portion of the data seglet following the decompression endpoint. Such technique may involve the storing of a mapping that maps, for each data block within the data seglet, an identifier of the data block to a decompression endpoint that indicates a portion of the data seglet that includes the data block. In certain embodiments, the decompression endpoint may coincide with the ending position of the compressed version of the data block within the data seglet, while in other embodiments, the decompression endpoint may be after the ending position of the compressed version of the data block. Decompressing only a portion of the data seglet may be performed with less computational resources and in a shorter amount of time than if the entirety of the data seglet were decompressed.

In the storing of a data block, a certain procedure may be employed to determine whether the data block should be stored in the current data seglet or in the next data seglet. First, the data block is compressed using the dictionary of the current data seglet. Then, the size of the compressed block is determined, and a candidate seglet length is determined by summing a running length of the current data seglet with the compressed data block size. If the candidate seglet length is less than or equal to a maximum seglet length, the data block is stored in the current data seglet. Otherwise, the data block is compressed using a dictionary of the next data seglet (which may initially be void of entries), and the compressed data block is stored in the next data seglet.

These and other embodiments of the invention are more fully described in association with the drawings below.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. Description associated with any one of the figures may be applied to a different figure containing like or similar components/steps. While the flow diagrams each present a series of steps in a certain order, the order of the steps is for one embodiment and it is understood that the order of steps may be different for other embodiments.

Figure 1:
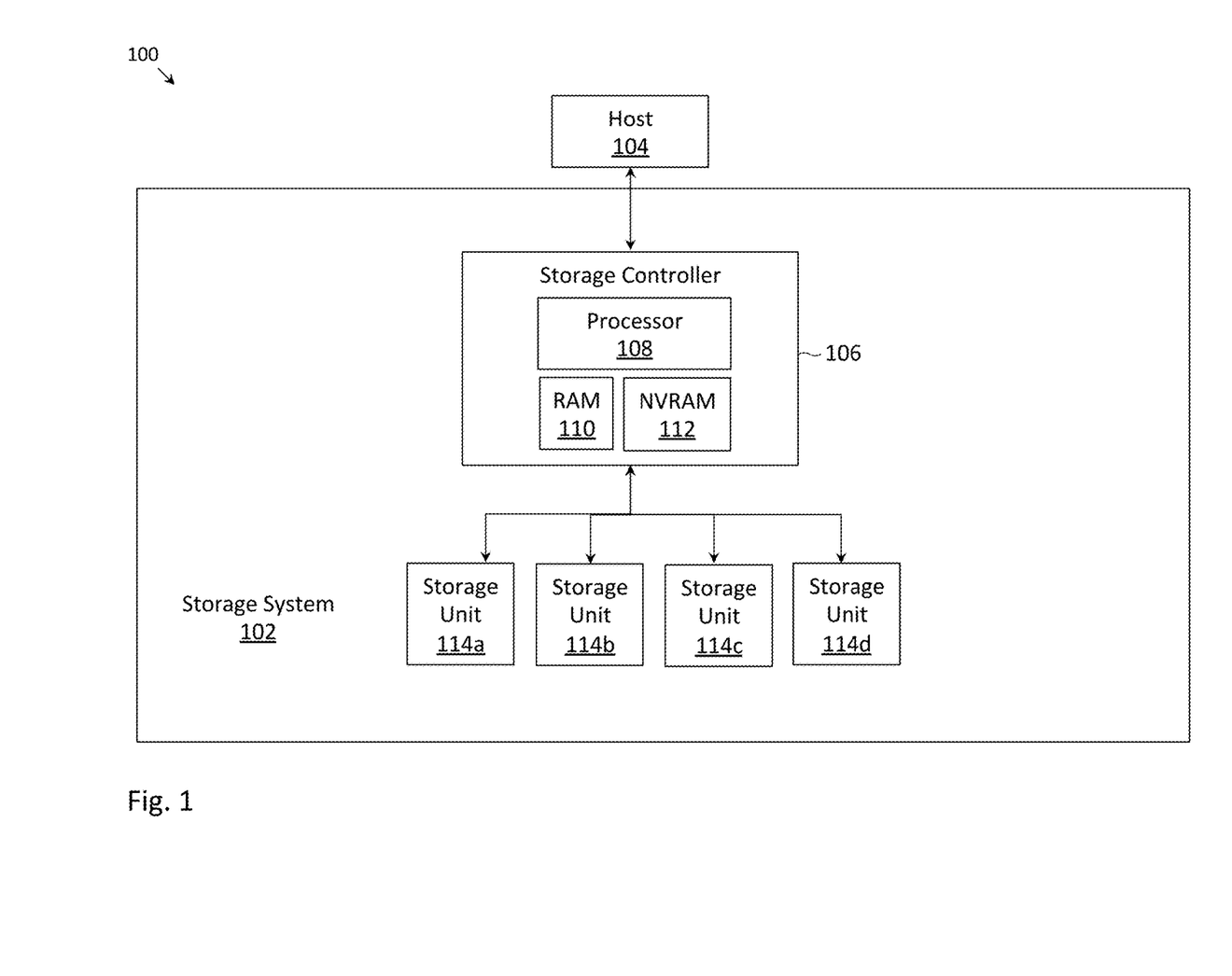
FIG. 1 depicts a storage system communicatively coupled to a host, in accordance with one embodiment.

FIG. 1 depicts system 100 in which storage system 102 may be communicatively coupled to host 104, in accordance with one embodiment. Host 104 may transmit read and/or write requests to storage system 102, which in turn may process the read and/or write requests. While not depicted, storage system 102 may be communicatively coupled to host 104 via a network. The network may include a LAN, WAN, MAN, wired or wireless network, private or public network, etc.

Storage controller 106 of storage system 102 may receive the read and/or write requests and may process the read and/or write requests by, among other things, communicating with one or more of a plurality of storage units (114a, 114b, 114c, 114d). Each of the storage units may be a disk drive (e.g., using a disk-based storage medium), a solid-state drive (e.g., using a flash-based storage medium), an optical drive (e.g., using a storage medium which is read with a light source), etc. While four storage units have been depicted in storage system 102, this is not necessarily so, and a different number of storage units may be employed in practice.

Storage controller 106 may include processor 108, random access memory (RAM) 110 and non-volatile random access memory (NVRAM) 112. Processor 108 may direct the handling of read and/or write requests, may compress data before the data is stored on one or more of storage units 114a-114d, and may decompress data that is retrieved from one or more of storage units 114a-114d before the data is returned to host 104. Such process of compressing and decompressing data is described below in more detail. More specifically, processor 108 may perform any of the processes described below in association with FIGS. 4-5. RAM 110 may store instructions that, when executed by processor 108, cause processor 108 to perform one or more of the processes of FIGS. 4-5. RAM 110 may also act as a buffer, storing yet to be processed read and/or write requests, storing data that has been retrieved from storage units 114a-114d, but not yet provided to host 104, etc. NVRAM 112 may store data that must be maintained, despite a loss of power to storage system 102.

Figure 2:
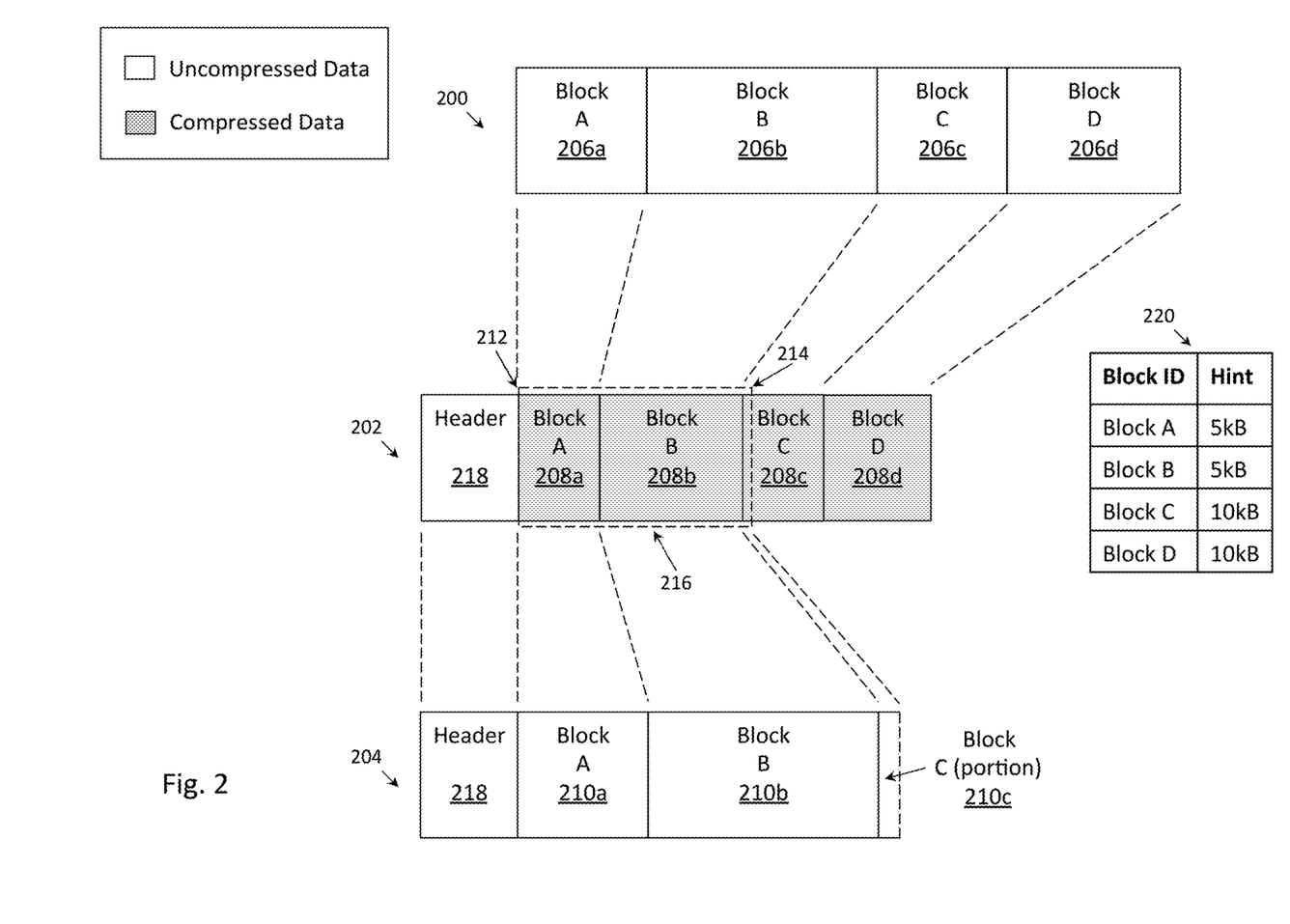
FIG. 2 illustrates the creation of a data seglet with a plurality of compressed blocks, and the decompression of some of the data blocks of the data seglet, in accordance with one embodiment.

FIG. 2 illustrates the creation of data seglet 202 that is stored in one or more of storage units 114a-114d, and the decompression of some of the data blocks of data seglet 202, in accordance with one embodiment. Reference numeral 200 indicates a plurality of data blocks (including block A 206a, block B 206b, block C 206c, and block D 206d) that are to be stored in one or more of storage units 114a-114d. In one embodiment, blocks 206a, 206b, 206c and 206d may be received in parallel (e.g., at the same time) by storage controller 106, while in another embodiment, blocks 206a, 206b, 206c and 206d may be sequentially received (e.g., block A is received, followed by block B, followed by block C, and so on). While four blocks are depicted in the example of FIG. 2, it is understood that the techniques described herein are applicable to a greater or fewer number of blocks.

Storage controller 106 may compress blocks 206a, 206b, 206c and 206d to form blocks 208a, 208b, 208c and 208d, respectively. Header 218 may be prepended to the compressed blocks to form data seglet 202. Header 218 may include various information for ensuring the integrity of the data blocks. For instance, header 218 may store a checksum (e.g., an XOR of all the bits of a block), and the checksum of a decompressed block may be compared with its original checksum (as stored in header 218) before the block is returned. As another example, header 218 may include an uncompressed size (or length) of each of the blocks, and a decompressed block's size may be compared to its original size (as stored in header 218) before the block is returned.

In one embodiment, the compression algorithm used to compress each of the blocks may utilize a "shared dictionary" for the plurality of blocks 200 (i.e., a dictionary that is shared between the plurality of blocks), for increased compression efficiency. Example compression algorithms that may use a shared dictionary include LZ4, etc. A consequence of using a shared dictionary is that the blocks may be compressed in a certain order and decompressed in a certain order. In the example of FIG. 2, the blocks may be compressed in the following order. Block A may be compressed first (and a dictionary would be formed during the compression of block A), block B may then be compressed (the compression of block B utilizing and possibly building upon the dictionary formed during the compression of block A), block C may then be compressed (the compression of block C utilizing and possibly building upon the dictionary formed during the compression of block B), and so on. When a block is read, all of the "earlier" compressed blocks ("earlier" referring to the blocks in the seglet which were compressed prior to the instant block) would need to be first decompressed (i.e., in order to form the dictionary used during decompression) before the instant block can be decompressed and read. For example, if block B (208b) were requested by host 104, block A (208a) would first need to be decompressed before block B (208b) can be decompressed and returned to host 104.

In view of such requirement to decompress blocks in a certain order, one optimization to decrease the time taken to retrieve a data block from a data seglet is to decompress only as much of the data seglet that is needed to return the requested data block. For example, in order to return block B, only blocks A and B are decompressed, which eliminates the time that would have been taken to decompress blocks C and D. Similarly, in order to return block C, only blocks A, B and C are decompressed, which eliminates the time that would have been taken to decompress block D. Of course, if block D were requested, all of blocks A, B, C and D would need to be decompressed, so there would not be any efficiency gains for retrieving block D. Nevertheless, on average there will be efficiency gains, as at least some data requests will involve decompressing only a portion of a data seglet.

To enable such efficiency gains, mapping 220 from data blocks to hints may be stored (e.g., stored in RAM 110, NVRAM 112 and/or storage units 114a-114d) when data seglet 202 is stored in one or more of storage units 114a-114d. More specifically, mapping 220 may map an identifier of a data block (e.g., a block number) to a hint that indicates how much of the data seglet needs to be decompressed in order to read the data block. For simplicity of explanation, generic block identifiers (e.g., "Block A", "Block B", "Block C" and "Block D") are used in mapping 220.

A hint may indicate a decompression endpoint for a data block within a data seglet, in which the decompression endpoint is at or after the ending position of the data block and is at or before the ending position of the data seglet. In the example of FIG. 2, reference numeral 214 marks a possible decompression endpoint for blocks A and B. The hint may indicate a size or an offset from a starting position of the data seglet. In the example of FIG. 2, the starting position of data seglet 202 may be indicated by reference numeral 212 (e.g., the starting position of block A). Another possibility for the starting position of data seglet 202 could be the starting position of header 218. In the example of FIG. 2, the hint for blocks A and B was 5 kB, and the hint for blocks C and D was 10 kB (as shown in mapping 220). In other words, the hint indicates that 5 kB of data seglet 202 should be decompressed to retrieve either blocks A or B (or both blocks A and B), whereas 10 kB of data seglet 202 should be decompressed to retrieve either blocks C or D (or both blocks C and D).

In another embodiment, the hint may indicate a portion of data seglet 202. For instance, mapping 220 could map block A to the first half of data seglet 202, and blocks B, C and D to the second half of data seglet 202. Based on the hint, when block A is retrieved, only the first half of data seglet 202 may be decompressed, whereas when blocks B, C and/or D are retrieved, all of data seglet 202 may be decompressed.

In another embodiment, the hint may indicate the ending position of a compressed block (e.g., the ending position with respect to the starting position). For instance, mapping 220 could map blocks A, B, C and D to 2 kB, 6 kB, 8 kB and 11 kB, respectively. Such an embodiment may avoid any unnecessary decompression, but may increase the size of mapping 220 (as more bits would be required to store the ending positions with a finer degree of granularity).

Importantly, the hint (or more precisely, the decompression endpoint) would vary for at least two of the data blocks of a data seglet. In other words, all blocks of a seglet would not be mapped to the size of the entire data seglet, which would provide no advantages over previous schemes in which the entire data seglet is decompressed whenever any of the blocks are read.

The process to read (or retrieve) one or more of the blocks from data seglet 202 is now described. A request may be received to read one or more of the blocks from data seglet 202. In the example of FIG. 2, assume that the request is to read block B (208*b*). The request may include an identifier the desired block. The identifier of the desired block may be mapped to a data seglet that stores the desired block. In the example of FIG. 2, block B (208*b*) would be mapped to data seglet 202. An index may be consulted to determine the logical address where seglet 202 is stored, which in turn may be mapped to one or more physical addresses of storage units 114*a*-114*d*.

Next, data seglet 202 may be read from the one or more storage units 114*a*-114*d* (e.g., the read relying upon the logical address of data seglet 202). Mapping 220 may then be referenced to determine how much of data seglet 202 to decompress in order to retrieve the desired block. For the retrieval of block B, mapping 220 indicates that 5 kB of data seglet 202 should be decompressed. Assume that 5 kB of data seglet 202 corresponds to contiguous portion 216 of data seglet 202. Contiguous portion 216 of data seglet 202 is then decompressed, as shown in partially decompressed seglet 204. Partially decompressed seglet 204 may include header 218, decompressed block A (210*a*), decompressed block B (210*b*), and partially decompressed block C (210*c*). In another embodiment (not depicted), if the decompression endpoint 214 were to coincide with the end of block B 208*b*, then partially decompressed seglet 204 would not include partially decompressed block C (210*c*). One will appreciate that if the decompression endpoints are "fixed points" (e.g., 5 k, 10 k, etc.), then it is likely that decompressed fragments such as 210*c* will be generated, whereas if the decompression endpoints are chosen to align with the ending positions of the compressed blocks, then decompressed fragments will not be generated.

To retrieve block B (210*b*), certain information from header 218 may be utilized. For example, the uncompressed size (or length) of block A (210*a*) and block B (210*b*) may be determined from header 218. Assuming that the size (or length) of header 218 is a fixed number, the starting position of block B (210*b*) may be determined as the sum of the size of header 218 and the size of block A (210*a*). The ending position of block B (210*b*) may be determined as the sum of the size of header 218, the size of block A (210*a*), and the size of block B (210*b*). With the starting position and the ending position of block B (210*b*) determined, block B (210*b*) can be read (or retrieved) from partially decompressed seglet 204. To assure data integrity, a checksum of decompressed block B (210*b*) may be computed, and such checksum can be compared to the checksum of original block B (206*b*), which may be stored in header 218. It is noted that in another embodiment, the size of the compressed and/or uncompressed blocks may be stored at a location other than header 218, for example in the same index used to store the logical address of data seglet 202.

It is noted that in another embodiment, the entirety of data seglet 202 need not be read from the one or more storage units 114*a*-114*d*, and only header 218 and contiguous portion 216 may be read. Such embodiment will be described further in FIG. 4B.

If not already apparent, the term "data seglet" is used to generally refer to a plurality of data blocks. In the examples of FIG. 2, header 218 was described as being part of a data seglet, but this is not necessarily so, and header 218 may be interpreted as being separate from a data seglet. A data seglet may refer to a plurality of blocks which have been compressed with a shared dictionary to achieve a better compression ratio (as in data seglet 202). A data seglet may also refer to a plurality of uncompressed blocks (as in data seglet 204). In another embodiment, a data seglet may be interpreted as a container for storing a plurality of data blocks (in either a compressed or uncompressed format).

Figure 3A:
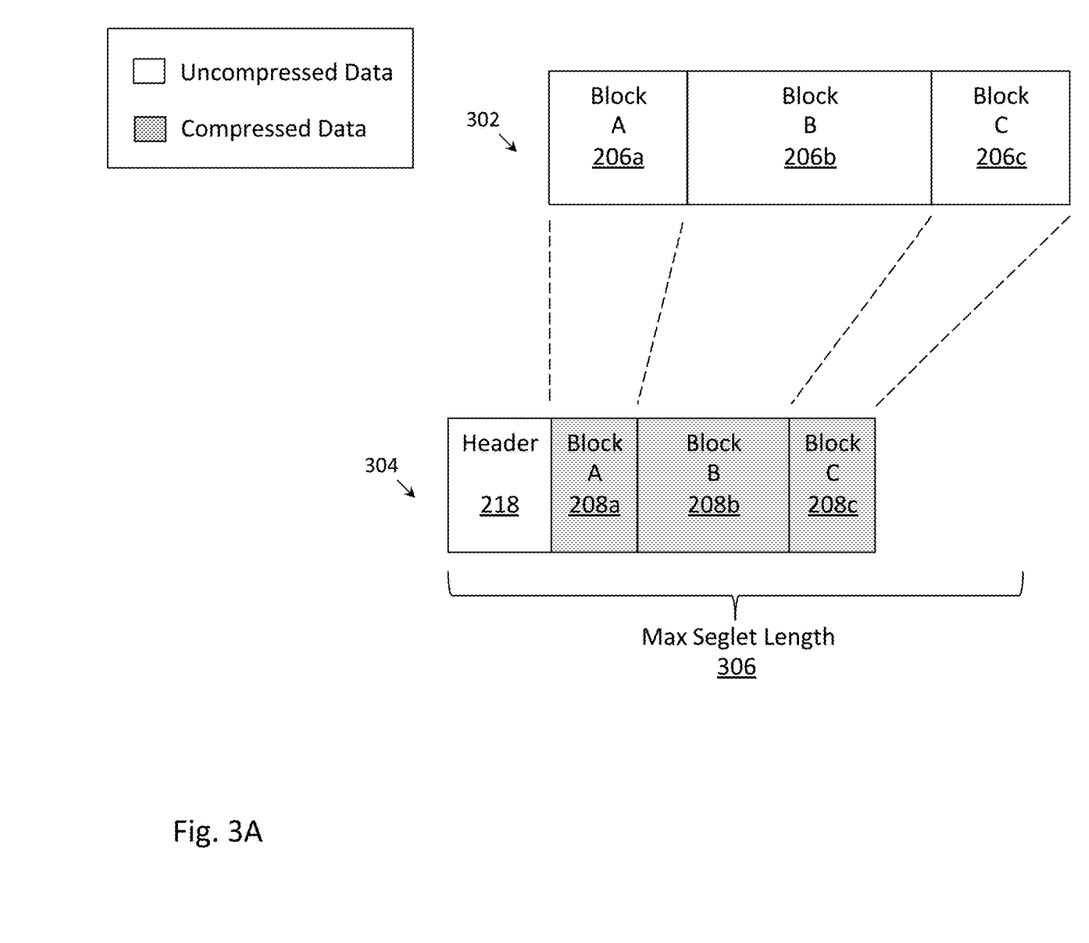
FIGS. 3A-3E illustrate a process of deciding whether to insert a compressed data block at the end of an existing data seglet or at the beginning of a new data seglet, in accordance with one embodiment.

FIGS. 3A-3E illustrate a process of deciding whether to insert a compressed data block at the end of an existing data seglet or at the beginning of a new data seglet, in accordance with one embodiment. FIG. 3A depicts uncompressed data blocks 302 (including block A 206*a*, block B 206*b*, and block C 206*c*) and data seglet 304 (including header 218, compressed block A 208*a*, compressed block B 208*b*, and compressed block C 208*c*). FIG. 3A also illustrates maximum seglet length 306, and data seglet 304 is shown to be less than maximum seglet length 306. It is noted that maximum seglet length 306 in FIG. 3A includes the size of header 218, while in other embodiments, the maximum seglet length 306 may exclude the size of header 218.

Figure 3B:
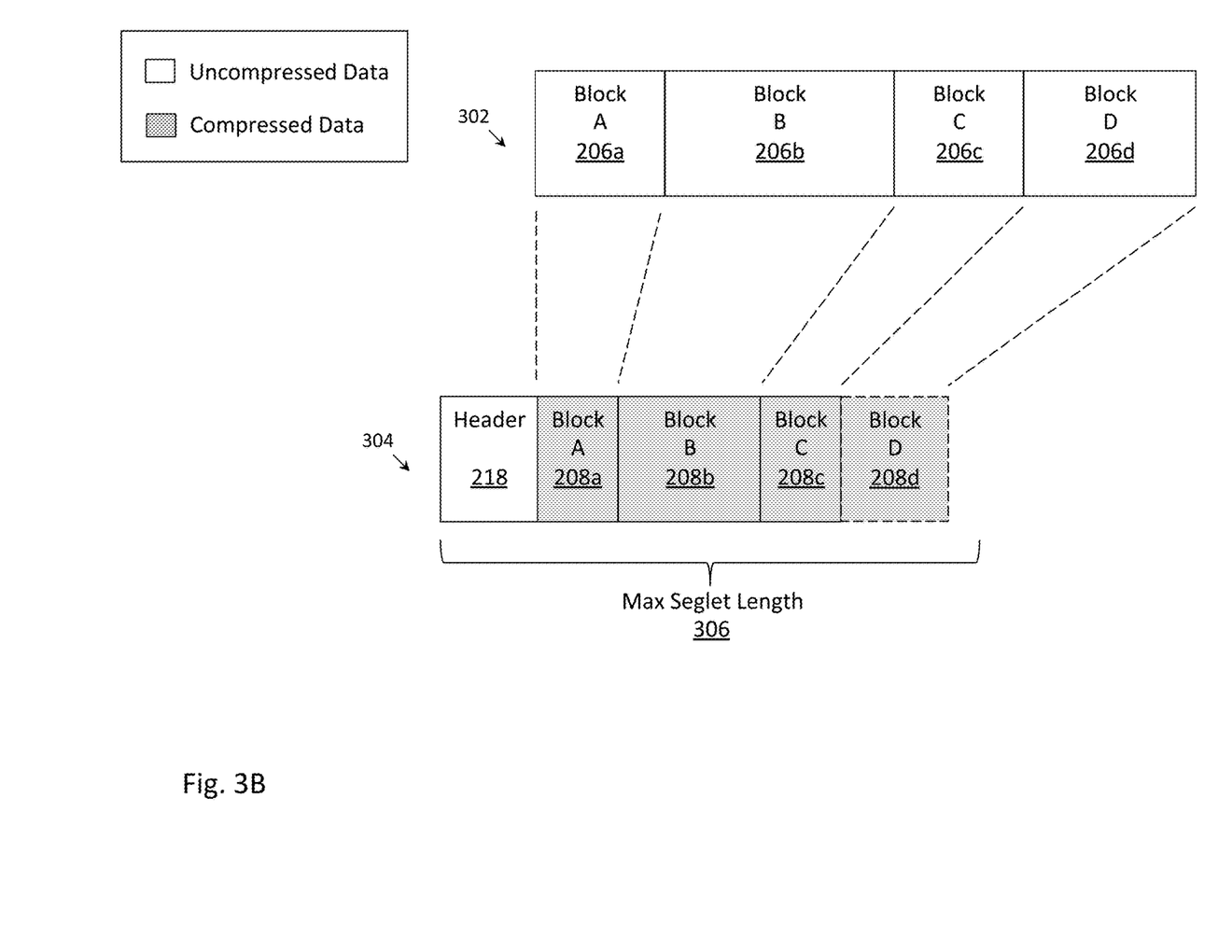
Figure 3C:
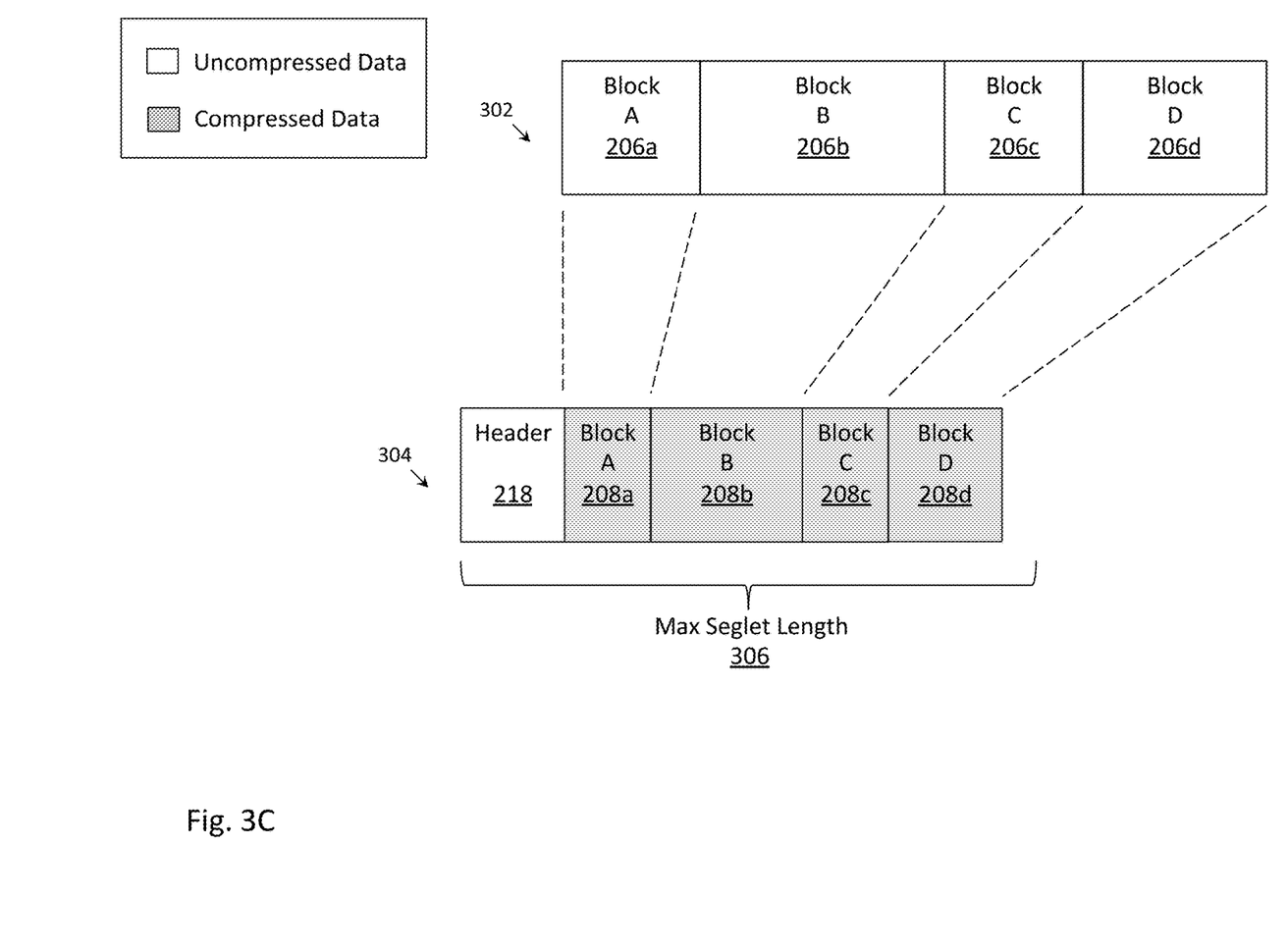

FIG. 3B illustrates the scenario in which seglet 304 can accommodate an additional compressed block (i.e., block D 208*d*). The total size of seglet 304 including the size of compressed block D may be compared to maximum seglet length 306. Since the total size is less than maximum seglet length 306 (as shown in FIG. 3B), the compressed version of block D (208*d*) may be inserted at the end of seglet 304 (as shown in FIG. 3C).

Figure 3D:
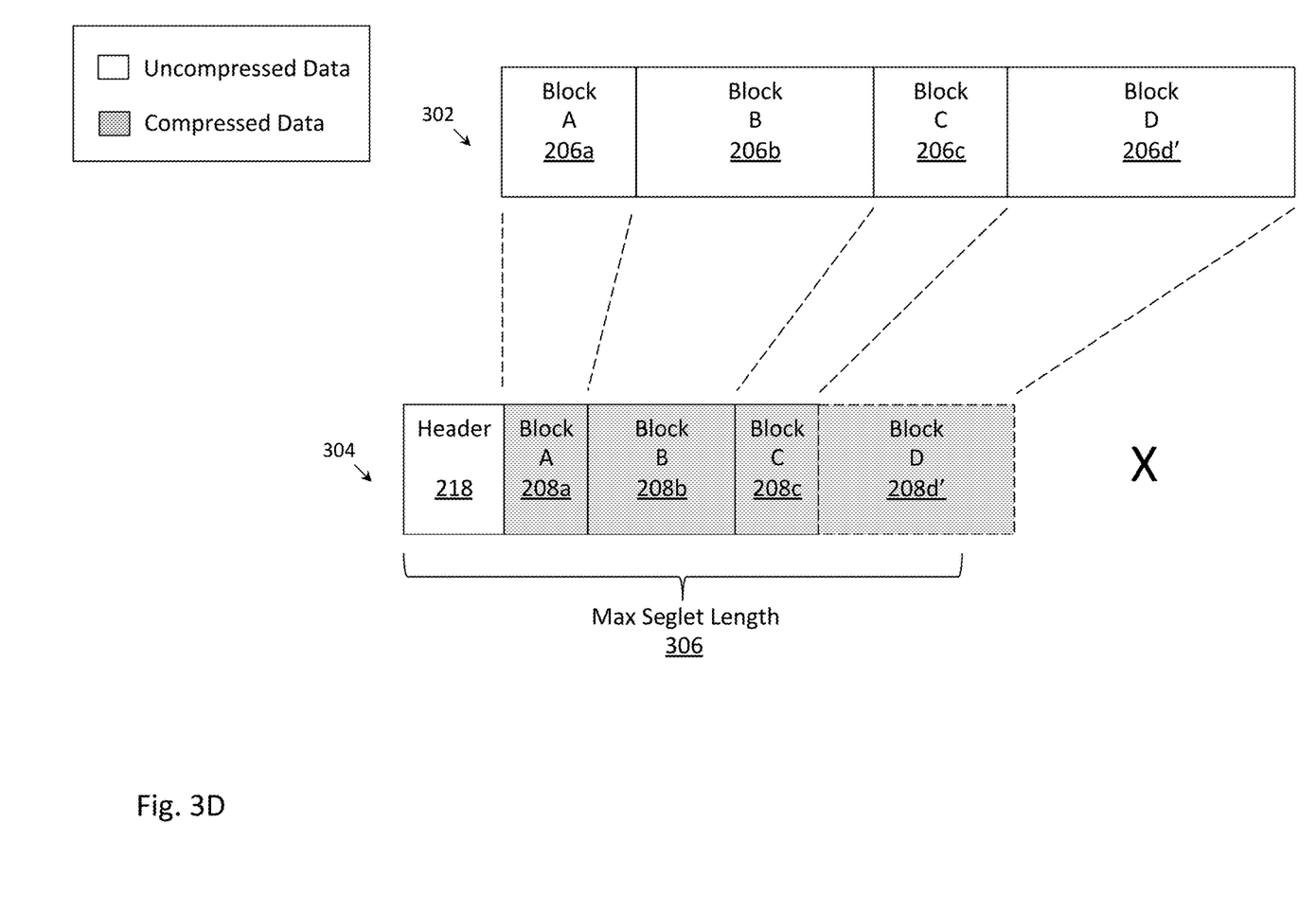
Figure 3E:
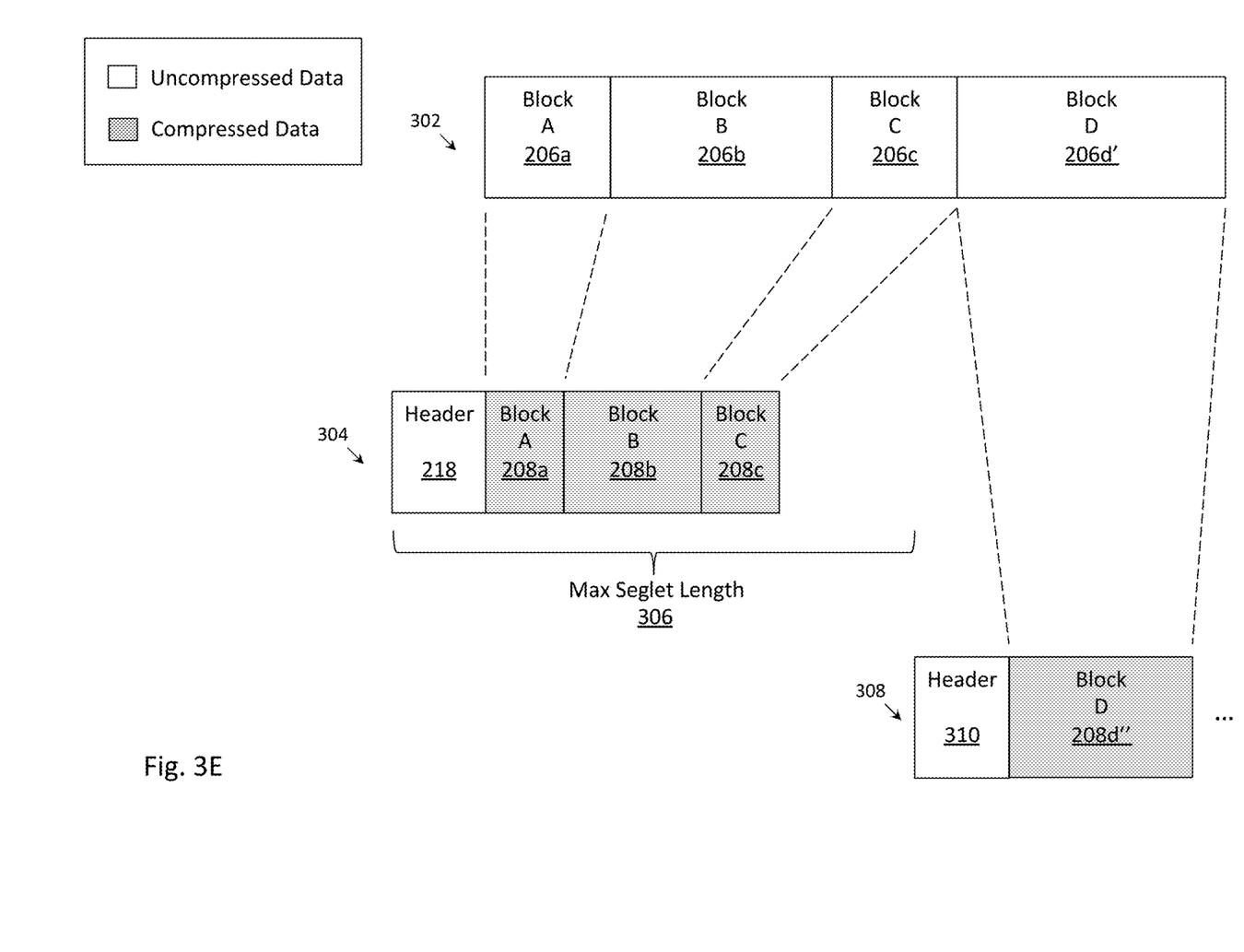

FIG. 3D illustrates the scenario in which seglet 304 cannot accommodate an additional compressed block (i.e., block D 208*d'*). The total size of seglet 304 including the compressed size of block D may be compared to maximum seglet length 306. As depicted in FIG. 3D, the total size is greater than maximum seglet length 306. Therefore, the compressed version of block D (208*d"*) may be inserted at the beginning of new seglet 308 (i.e., after header 310), as depicted in FIG. 3E. For completeness, it is noted that the compressed version of block D (208*d'*) in FIG. 3D will be compressed using the shared dictionary of seglet 304, whereas the compressed version of block D (208*d"*) in FIG. 3E will be compressed using the shared dictionary of seglet 308. Therefore, the aforementioned compressed versions of block D will typically not be identical to one another.

Figure 4A:
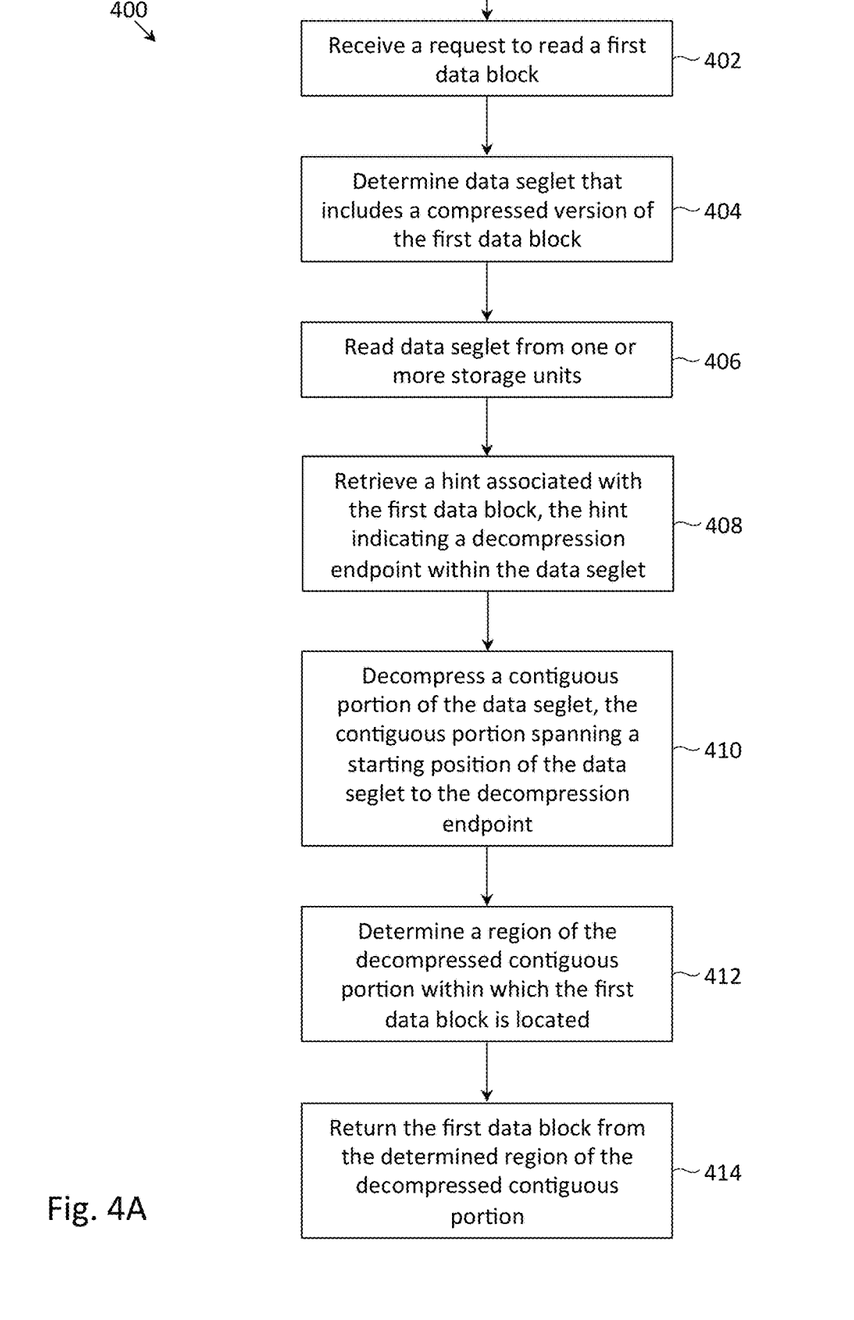
FIG. 4A-4B depict flowcharts of two processes which may be used to retrieve a data block from a data seglet with a plurality of compressed data blocks, in accordance with one embodiment.

FIG. 4A depicts flowchart 400 of a process to retrieve a data block from a data seglet that includes a plurality of compressed data blocks, in accordance with one embodiment. At step 402, storage controller 106 may receive a request to read a first data block from one or more of storage units 114*a*-114*d* (i.e., "first" meaning one particular data block, and not necessary the first in a sequence of data blocks). As explained above, the request may include an identifier of the first data block.

At step 404, storage controller 106 may determine a data seglet that includes the first data block. Such determination may involve referencing a mapping that maps data block identifiers to data seglet identifiers. As described above, the data seglet may include a data header and a plurality of compressed blocks, one of which is a compressed version of the first data block. The data seglet may include a starting position (e.g., starting position of header, ending position of header, etc.), and an ending position (e.g., ending position of the last data block of the data seglet). Each of the compressed data blocks may include a starting position and an ending position.

At step 406, storage controller 106 may read the data seglet that includes the compressed version of the first data block. Such read may include determining a logical address of the determined data seglet, and reading the data seglet at the logical address (which might corresponding to one or more physical addresses distributed across one or more of storage units 114a-114d). In the context of FIG. 4A, it is noted that the read of the data seglet may involve reading the entire data seglet.

At step 408, storage controller 106 may retrieve a hint associated with the first data block, the hint indicating a decompression endpoint within the data seglet. As explained above, the decompression endpoint may be at or after the ending position of the first data block and may be at or before the ending position of the data seglet. Further, the decompression endpoint would vary for at least two of the data blocks within the data seglet. In other words, all blocks of the data seglet would not be mapped to the size of the entire data seglet (which would provide no advantages over previous schemes in which the entire data seglet is decompressed).

At step 410, storage controller 106 may decompress a contiguous portion of the data seglet. The contiguous portion may span from the starting position of the data seglet to the decompression endpoint. As explained above, the decompression of the contiguous portion of the data seglet may utilize a shared dictionary between the data blocks.

At step 412, storage controller 106 may determine a region of the decompressed contiguous portion within which the first data block is located. As explained above, such determination may include determining a starting position and ending position of the first data block (relative to the starting position of the data seglet). The starting position of the first data block may be determined by summing the size of the data seglet header and the uncompressed sizes of the data blocks preceding the first data block (if any such preceding blocks exist). The ending position of the first data block may be determined by summing the size of the data seglet header, the uncompressed sizes of the data blocks preceding the first data block (if any such preceding blocks exist), and the uncompressed size of the first data block.

At step 414, storage controller 106 may return the first data block from the determined region of the decompressed contiguous portion. While FIG. 4A described a process for reading a single data block, it is understood that the process of FIG. 4A could be generalized to read a plurality of data blocks. For instance, if a plurality of data blocks is requested and each of the data blocks is located on a separate data seglet, the process of FIG. 4A may be repeated for each of the data blocks. If, however, two (or more) data blocks are requested which all are located on the same data seglet, the hint corresponding to each of the requested data blocks may be consulted from mapping 220, and the largest decompression endpoint from the consulted hints may be used to decompress all of the requested data blocks.

Figure 4B:
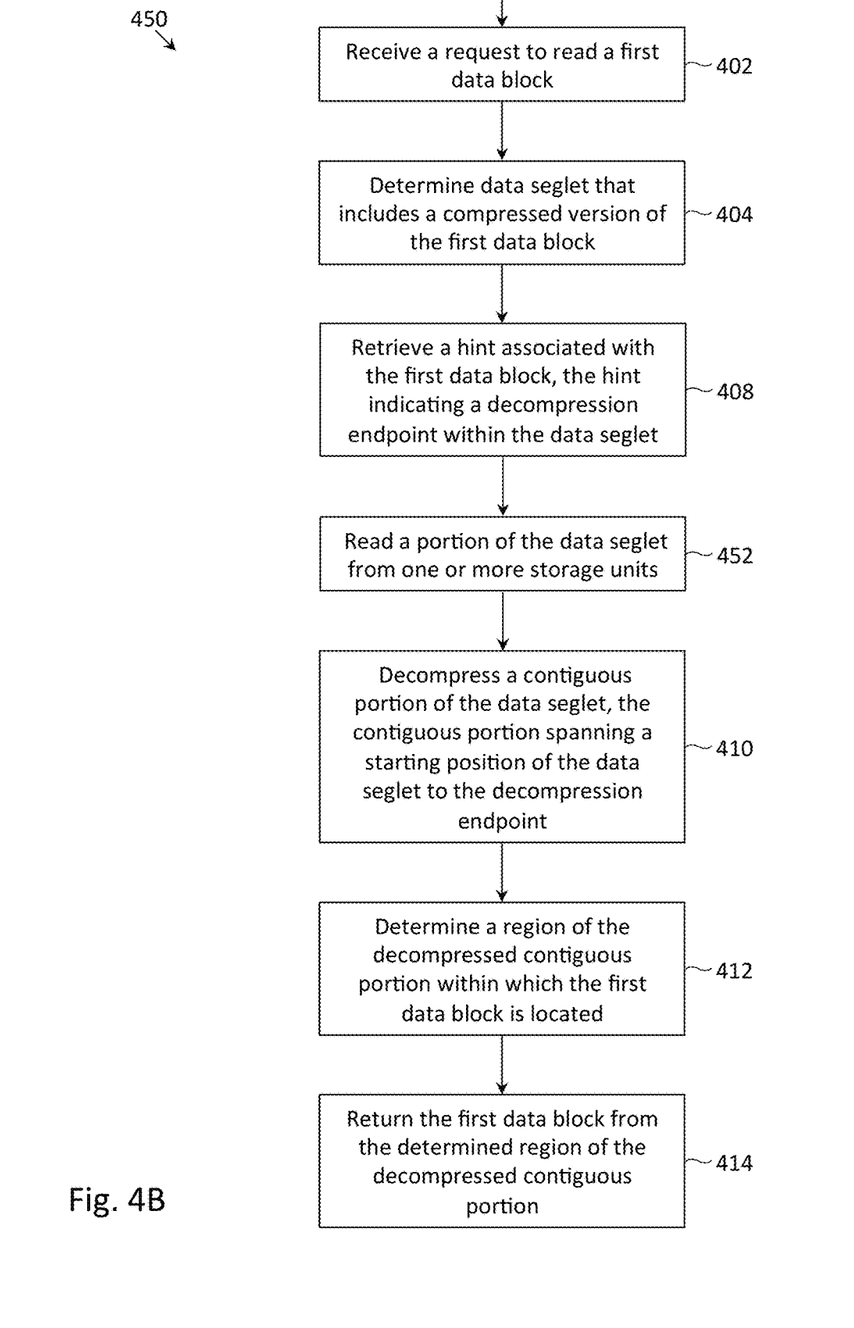

FIG. 4B depicts flowchart 450 of another process to retrieve a data block from a data seglet that includes a plurality of compressed data blocks, in accordance with one embodiment. Flowchart 450 is a variant of flowchart 400 described in FIG. 4A. Most of the steps of flowchart 450 and flowchart 400 are identical, except that in the process of flowchart 450, the entire data seglet need not be read from one or more storage units 114a-114d. To allow for this further optimization (i.e., a read optimization), the hint may be read (step 408) prior to the read of the data seglet, allowing only a portion of the data seglet to be read (step 452). In one embodiment, only the portion of the data seglet that spans from the starting position of the data seglet to the decompression endpoint indicated in the hint is read. In another embodiment, the portion of the data seglet that is read includes the portion of the data seglet spanning from the starting position of the data seglet to the decompression endpoint, but can include other portions of the data seglet.

If not already apparent, the process described in FIG. 4A offers efficiency gains in terms of a reduced amount of decompression, while the process described in FIG. 4B offers both a reduced amount decompression and a reduced amount of data that is read. It is noted that the processes described in FIGS. 4A and 4B may be used not only in the context of regular reads from user IO (input/output), but also in the context of garbage collection. In the latter case, if live blocks (e.g., non-obsolete blocks) are located only in the first half of a data seglet, and dead blocks (e.g., obsolete blocks) are located only in the second half of the data seglet, then storage controller 106 does not have to read the second half of the data seglet. Storage controller 106 can simply read first half of the data seglet and decompress the live blocks from the first half.

Figure 5:
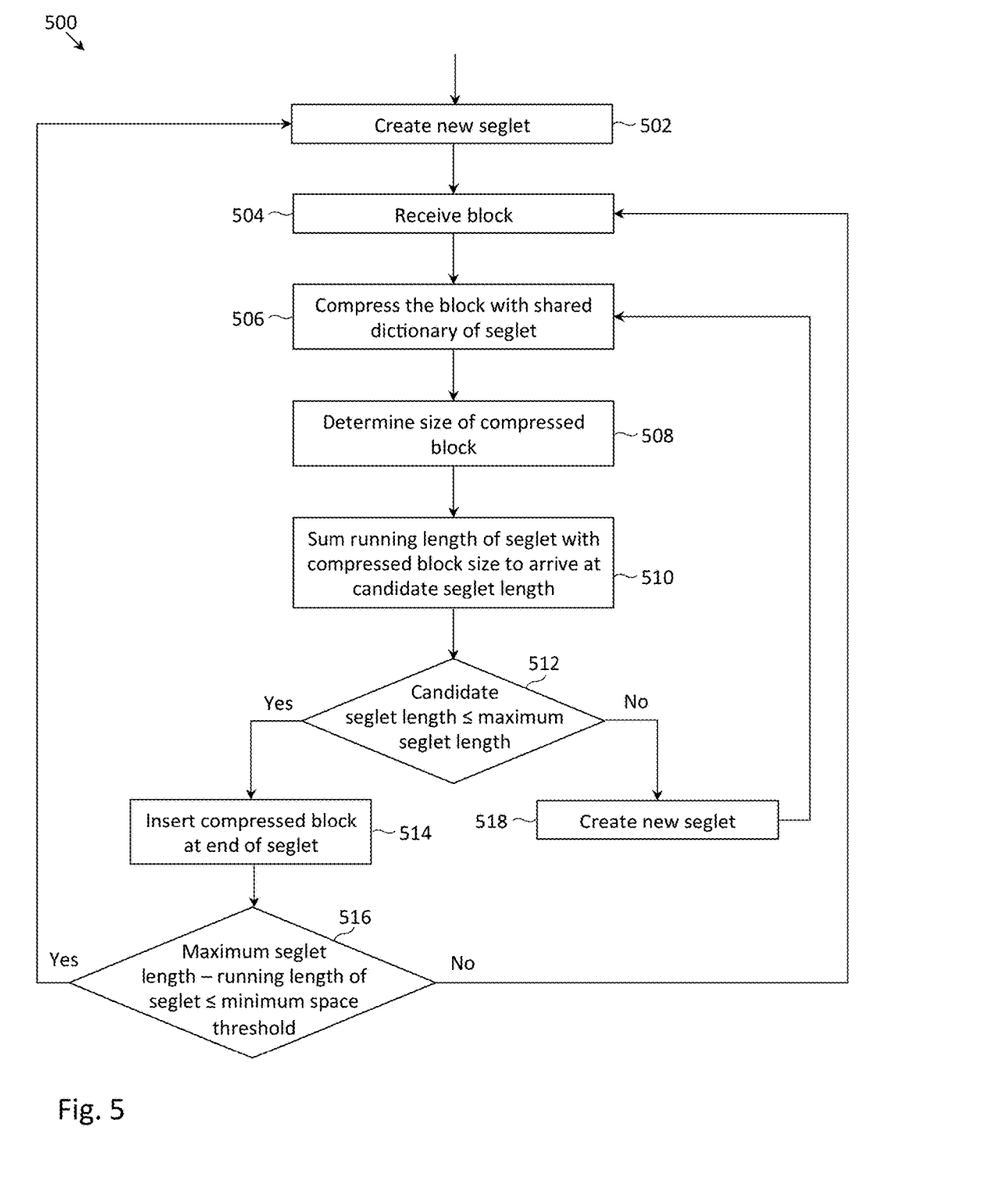
FIG. 5 depicts a flowchart of a process for inserting a compressed data block at the end of an existing data seglet or at the beginning of a new data seglet, in accordance with one embodiment.

FIG. 5 depicts flowchart 500 of a process for inserting a compressed data block at the end of an existing data seglet or at the beginning of a new data seglet, in accordance with one embodiment. At step 502, storage controller 106 may create a new data seglet as part of an initialization step. At step 504, storage controller 106 may receive a block that is to be stored on one or more of storage units 114a-114d. At step 506, storage controller 106 may compress the block with the shared dictionary of the data seglet (using a compression algorithm such as LZ4, etc.). If the data seglet is a newly instantiated seglet, the shared dictionary may initially be void of entries (e.g., entries that map binary strings to codewords). At step 508, storage controller 106 may determine a size of the compressed block. At step 510, storage controller 106 may sum a "running length" (i.e., current length) of the data seglet with the compressed block size to arrive at a candidate seglet length. At step 512, storage controller 106 may compare the candidate seglet length with a maximum seglet length (e.g., 16 kB). The maximum seglet length may be a predetermined value and/or a user-configurable value. If the candidate seglet length is less than or equal to the maximum seglet length ("Yes" branch of step 512), storage controller 106 may insert the compressed block at the end of the seglet (step 514). Such insertion may take place at a buffer of storage controller 106 (e.g., RAM 110), before the data seglet is stored on one or more of storage units 114a-114d. If the candidate seglet length is greater than maximum seglet length ("No" branch of step 512), storage controller 106 may create a new data seglet (step 518). It is noted that the compressed version of the block that was previously determined at step 506 cannot be inserted in the data seglet created at step 518, because the compressed block will have been compressed using the shared dictionary of the existing seglet and not the shared dictionary of the data seglet created at step 518. Therefore, following step 518, the block will be compressed a second time at step 506, this time, using the shared dictionary of the new data seglet (which may initially be void of entries). The process may then proceed through steps 508, 510 and 512 (which have already been described), before the compressed block is finally inserted (at step 514) into the data seglet created at step 518. In one optimization (not depicted), steps 508, 510 and 512 may be omitted, and the process may proceed from step 506 directly to step 514 if the data seglet is a newly created seglet (since the compressed block will be the very first block inserted into the data seglet).

Following step 514, there may be an additional optimization step (i.e., to save wasted CPU cycles) in which the maximum seglet length minus the running length of the data seglet (i.e., running length updated to include the compressed block inserted at step 514) is compared to a minimum space threshold (e.g., 1 kB). If the maximum seglet length minus the running length of the data seglet is less than or equal to the minimum space threshold, this means that it is unlikely any further compressed blocks can be inserted at the end of the data seglet. Therefore, in response to such a determination, a new data seglet is created (step 502). Otherwise, if the maximum seglet length minus the running length is greater than the minimum space threshold, this means that it is likely (but not guaranteed) that a further compressed block can be inserted at the end of the seglet. Therefore, in response to such a determination, the process continues to step 504, in which the next block is received.

In another embodiment for deciding whether to insert a compressed data block at the end of an existing data seglet or at the beginning of a new data seglet (which may be in addition or alternative to the approach described in FIG. 5), the total number of compressed blocks within an existing data seglet may be compared to a threshold number (e.g., 16 blocks). If the total number of compressed blocks is less than the threshold number, an additional compressed block may be stored in the existing data seglet. If the total number of compressed blocks is equal to the threshold number, an additional compressed block may be stored in a new data seglet.

It is noted that in the description above, data blocks of data seglets were compressed, while the headers of data seglets were assumed to be stored in an uncompressed manner. In another embodiment, the header of data seglets may be compressed as well, and decompression of the header would then be required to read the information stored in the header. Also, in the context of compression using a "shared dictionary", the header of a data seglet may be compressed used the same dictionary that is used to compress the data blocks. Accordingly, the decompression of a data block may first require the decompression of the header of the data seglet in which the data block is located.

A simplified example will now be discussed to better appreciate the efficiency gains provided by the above-described decompression optimization. Suppose for simplicity that all seglets store four equally sized blocks. Further suppose that the blocks within each seglet are requested with an equal probability (i.e., probability of 0.25). Further suppose that, for each of the compressed blocks, the decompression endpoint is located at the ending position of the compressed block. On average, it is expected that only 62.5% of each seglet will be decompressed, leading to a decompression reduction of 37.5%. Such statistic may be calculated as $E[X]$, where $X$ is a random variable mapping the four possible outcomes of (block 1 being requested, block 2 being requested, block 3 being requested, and block 4 being requested) to the four corresponding fractions of the seglet that are decompressed (0.25, 0.5, 0.75, 1), respectively. Based on the assumption that each of the blocks within each seglet are requested with equal probability, $E[X]=0.25*0.25+0.25*0.5+0.25*0.75+0.25*1=0.625$. Similar calculations can be performed for an example using the above-described read optimization technique (with the same simplifications as above and assuming that a seglet is read up to the decompression endpoint for a corresponding block), which would reveal a reduction of 37.5% for the amount of data that is read from seglets.

Figure 6:
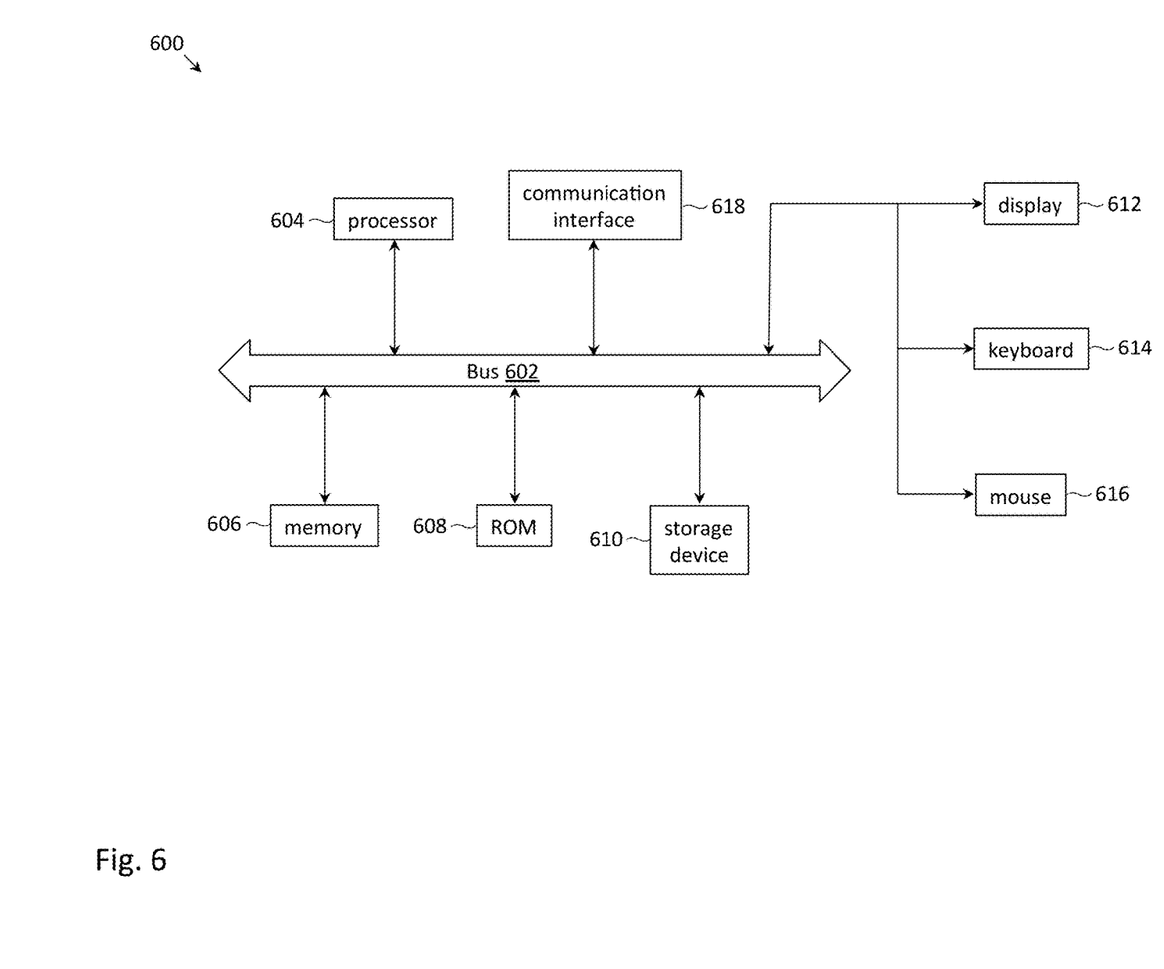
FIG. 6 depicts components of a computer system in which computer readable instructions instantiating the methods of the present invention may be stored and executed.

FIG. 6 provides an example of system 600 that is representative of any of host 104, storage controller 106, and one or more of storage units 114a-114d depicted above in FIG. 1 (i.e., any processor-based system). Note, not all of the various processor-based systems which may be employed in accordance with embodiments of the present invention have all of the features of system 600. For example, certain processor-based systems may not include a display inasmuch as the display function may be provided by a client computer communicatively coupled to the processor-based system or a display function may be unnecessary. Such details are not critical to the present invention.

System 600 includes a bus 602 or other communication mechanism for communicating information, and a processor 604 coupled with the bus 602 for processing information. System 600 also includes a main memory 606, such as a random access memory (RAM) or other dynamic storage device, coupled to the bus 602 for storing information and instructions to be executed by processor 604. Main memory 606 also may be used for storing temporary variables or other intermediate information during execution of instructions to be executed by processor 604. System 600 further includes a read only memory (ROM) 608 or other static storage device coupled to the bus 602 for storing static information and instructions for the processor 604. A storage device 610, which may be one or more of a floppy disk, a flexible disk, a hard disk, flash memory-based storage medium, magnetic tape or other magnetic storage medium, a compact disk (CD)-ROM, a digital versatile disk (DVD)-ROM, or other optical storage medium, or any other storage medium from which processor 604 can read, is provided and coupled to the bus 602 for storing information and instructions (e.g., operating systems, applications programs and the like).

System 600 may be coupled via the bus 602 to a display 612, such as a flat panel display, for displaying information to a user. An input device 614, such as a keyboard including alphanumeric and other keys, may be coupled to the bus 602 for communicating information and command selections to the processor 604. Another type of user input device is cursor control device 616, such as a mouse, a trackball, or cursor direction keys for communicating direction information and command selections to processor 604 and for controlling cursor movement on the display 612. Other user interface devices, such as microphones, speakers, etc. are not shown in detail but may be involved with the receipt of user input and/or presentation of output.

The processes referred to herein may be implemented by processor 604 executing appropriate sequences of processor-readable instructions stored in main memory 606. Such instructions may be read into main memory 606 from another processor-readable medium, such as storage device 610, and execution of the sequences of instructions contained in the main memory 606 causes the processor 604 to perform the associated actions. In alternative embodiments, hard-wired circuitry or firmware-controlled processing units (e.g., field programmable gate arrays) may be used in place of or in combination with processor 604 and its associated computer software instructions to implement the invention. The processor-readable instructions may be rendered in any computer language.

System 600 may also include a communication interface 618 coupled to the bus 602. Communication interface 618 may provide a two-way data communication channel with a computer network, which provides connectivity to the plasma processing systems discussed above. For example, communication interface 618 may be a local area network (LAN) card to provide a data communication connection to a compatible LAN, which itself is communicatively coupled to other computer systems. The precise details of such communication paths are not critical to the present invention. What is important is that system 600 can send and receive messages and data through the communication interface 618 and in that way communicate with other controllers, etc.

Thus, methods and systems for efficiently reading a data block from a data seglet with a plurality of compressed data blocks have been described. It is to be understood that the above-description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method, comprising:
    receiving a request for a first data block that is stored on one or more storage units;
    determining a data seglet that includes a compressed version of the first data block, wherein the data seglet includes a plurality of compressed data blocks, wherein the plurality of compressed data blocks includes the compressed version of the first data block, and wherein the data seglet includes a starting position and an ending position;
    retrieving, from a mapping which maps data blocks to hints, a first hint corresponding to the first data block, the first hint indicating a first decompression endpoint within the data seglet, wherein the first decompression endpoint is located at or after an ending position of the compressed version of the first data block and is located at or before the ending position of the data seglet, wherein the mapping maps a second data block of the data seglet to a second hint indicating a second decompression endpoint within the data seglet, and wherein the first decompression endpoint is different than the second decompression endpoint;
    reading at least a portion of the data seglet from the one or more storage units;
    decompressing a contiguous portion of the data seglet, the contiguous portion spanning only between the starting position of the data seglet and the first decompression endpoint;
    determining a region of the decompressed contiguous portion within which the first data block is located; and
    returning the first data block from the determined region of the decompressed contiguous portion.

2. The method of claim 1, wherein the at least portion of the data seglet that is read consists of the contiguous portion.

3. The method of claim 1, wherein the at least portion of the data seglet that is read includes an entirety of the data seglet.

4. The method of claim 1, wherein the first decompression endpoint is located at the ending position of the compressed version of the first data block.

5. The method of claim 1, wherein the first decompression endpoint is located after the ending position of the compressed version of the first data block.

6. The method of claim 1, wherein the first decompression endpoint is located before the ending position of the data seglet.

7. The method of claim 1, wherein the starting position of the data seglet is equal to a starting position of a header of the data seglet.

8. A storage system, comprising:
    a plurality of storage units;
    a processor communicatively coupled to the storage units; and
    a processor-readable medium storing instructions that, when executed by the processor, cause the processor to:
        receive a request for a first data block that is stored on one or more of the storage units;
        determine a data seglet that includes a compressed version of the first data block, wherein the data seglet includes a plurality of compressed data blocks, wherein the plurality of compressed data blocks includes the compressed version of the first data block, and wherein the data seglet includes a starting position and an ending position;
        retrieve, from a mapping which maps data blocks to hints, a first hint corresponding to the first data block, the first hint indicating a first decompression endpoint within the data seglet, wherein the first decompression endpoint is located at or after an ending position of the compressed version of the first data block and is located at or before the ending position of the data seglet, wherein the mapping maps a second data block of the data seglet to a second hint indicating a second decompression endpoint within the data seglet, and wherein the first decompression endpoint is different than the second decompression endpoint;
        read at least a portion of the data seglet from the one or more storage units;
        decompress a contiguous portion of the data seglet, the contiguous portion spanning only between the starting position of the data seglet and the first decompression endpoint;
        determine a region of the decompressed contiguous portion within which the first data block is located; and
        return the first data block from the determined region of the decompressed contiguous portion.

9. The storage system of claim 8, wherein the at least portion of the data seglet that is read consists of the contiguous portion.

10. The storage system of claim 8, wherein the at least portion of the data seglet that is read includes an entirety of the data seglet.

11. The storage system of claim 8, wherein the first decompression endpoint is located at the ending position of the compressed version of the first data block.

12. The storage system of claim 8, wherein the first decompression endpoint is located after the ending position of the compressed version of the first data block.

13. The storage system of claim 8, wherein the first decompression endpoint is located before the ending position of the data seglet.

14. The storage system of claim 8, wherein the starting position of the data seglet is equal to a starting position of a header of the data seglet.

15. A non-transitory machine-readable storage medium comprising software instructions that, when executed by a processor, cause the processor to:
receive a request for a first data block that is stored on one or more of a plurality of storage units of a storage system;
determine a data seglet that includes a compressed version of the first data block, wherein the data seglet includes a plurality of compressed data blocks, wherein the plurality of compressed data blocks includes the compressed version of the first data block, and wherein the data seglet includes a starting position and an ending position;
retrieve, from a mapping which maps data blocks to hints, a first hint corresponding to the first data block, the first hint indicating a first decompression endpoint within the data seglet, wherein the first decompression endpoint is located at or after an ending position of the compressed version of the first data block and is located at or before the ending position of the data seglet, wherein the mapping maps a second data block of the data seglet to a second hint indicating a second decompression endpoint within the data seglet, and wherein the first decompression endpoint is different than the second decompression endpoint;
read at least a portion of the data seglet from the one or more storage units;
decompress a contiguous portion of the data seglet, the contiguous portion spanning only from the starting position of the data seglet to the first decompression endpoint;
determine a region of the decompressed contiguous portion within which the first data block is located; and
return the first data block from the determined region of the decompressed contiguous portion.

16. The non-transitory machine-readable storage medium of claim 15, wherein the at least portion of the data seglet that is read consists of the contiguous portion.

17. The non-transitory machine-readable storage medium of claim 15, wherein the at least portion of the data seglet that is read includes an entirety of the data seglet.

18. The non-transitory machine-readable storage medium of claim 15, wherein the first decompression endpoint is located at the ending position of the compressed version of the first data block.

19. The non-transitory machine-readable storage medium of claim 15, wherein the first decompression endpoint is located after the ending position of the compressed version of the first data block.

20. The non-transitory machine-readable storage medium of claim 15, wherein the first decompression endpoint is located before the ending position of the data seglet.

* * * * *